(12) United States Patent
Tsai et al.

(10) Patent No.: US 8,479,132 B2
(45) Date of Patent: Jul. 2, 2013

(54) ACTIVE TRACE ASSERTION BASED VERIFICATION SYSTEM

(75) Inventors: Kuen-Yang Tsai, Shueilin Township, Yunlin County (TW); Yung-Chuan Chen, Kaohsiung (TW); Chun-Yi Lo, Miaoli (TW)

(73) Assignee: Synopsys, Inc., Mountain View, CA (US)

( * ) Notice: Subject to any disclaimer, the term of this patent is extended or adjusted under 35 U.S.C. 154(b) by 1346 days.

(21) Appl. No.: 11/455,134

(22) Filed: Jun. 16, 2006

(65) Prior Publication Data

US 2007/0294651 A1  Dec. 20, 2007

(51) Int. Cl.
*G06F 17/50*  (2006.01)

(52) U.S. Cl.
USPC .......................................................... 716/111

(58) Field of Classification Search
USPC ........................................... 716/11, 4–6, 111
See application file for complete search history.

(56) References Cited

U.S. PATENT DOCUMENTS

| | | | |
|---|---|---|---|
| 5,801,958 A * | 9/1998 | Dangelo et al. .................. 716/18 |
| 6,499,132 B1 | 12/2002 | Morley et al. |
| 6,591,402 B1 * | 7/2003 | Chandra et al. .................... 716/5 |
| 7,079,997 B1 * | 7/2006 | Hsu et al. ......................... 703/14 |
| 7,404,160 B2 * | 7/2008 | Piper et al. ......................... 716/5 |
| 2005/0268265 A1 * | 12/2005 | Ly et al. ............................. 716/6 |
| 2006/0085774 A1 * | 4/2006 | Moorby ............................. 716/5 |
| 2006/0101368 A1 * | 5/2006 | Kesarwani et al. ............. 716/11 |
| 2006/0190239 A1 * | 8/2006 | Piper et al. ....................... 703/26 |

OTHER PUBLICATIONS

Fitzpatrick, Tom, "SystemVerilog Assertions Unify Design and Verification," EEdesign.com, Oct. 17, 2003.

* cited by examiner

*Primary Examiner* — Vuthe Siek
*Assistant Examiner* — Mohammed Alam
(74) *Attorney, Agent, or Firm* — Kilpatrick Townsend & Stockton LLP

(57) ABSTRACT

A computer processes simulation data indicating values of circuit signals as functions of simulation time to determine whether a circuit exhibits a property defined by an assertion. The assertion expresses the property as a sequence of expressions, each a function of one or more variables, where each variable represents a value of one or more signals or a value of another sequence of expressions. The assertion statement separately defines an evaluation time for each expression, a particular simulation time at which the expression is to be evaluated. Each expression must evaluate true if the circuit has the property. The computer produces a display including a representation of each expression of the property including a separate variable symbol for each of its variables. For each expression that evaluated false, the computer identifies each variable that caused that expression to evaluate false and distinctively marks that variable's symbol relative to other variable symbols within the display. For each expression that evaluated true, the computer identifies the evaluation time contributing the fulfillment of assertion property. The computer also annotates the representation of each expression with its corresponding evaluation time and annotates each displayed variable symbol with a value of the variable it represents.

34 Claims, 11 Drawing Sheets

FIG. 5

Assertion Active Trace

Begin Time: 5000
End Time: 25000 a_S2: assert property(
  [25000]
  p1
);

property p1:
  [5000]
  @(posedge clk) (((((t1+t2)>=1) ##1:3 ((t1+bus2) >= (((bus1-t2)+2))) ##2 ((bus1 + (t1 && t2)) <= bus2)) ##1:3 (s1 or s2));
  [9000] [13000] [25000]
end property sequence s1;
  [19000]  [25000]
  (((t1==1) ##3 ((bus1>=2) && (t2 == 1)));
  ⟨TRUE⟩  ⟨FALSE⟩ ← 64
          ← 66
end seqence

[SHRINK] [EXPAND] [EXPAND ALL] [BACK]
                                  ↖ 68

FIG. 6

Assertion Active Trace

Begin Time: 5000
End Time: 25000 a_S2: assert property (

25000 p1

);

property p1:

5000        9000        13000        25000

@(posedge clk) (((((t1+ t2)>=1) ##1:3 ((t1+ bus2) >= ((bus1-t2 ) +2))) ##2 ((bus1 + (t1 && t2)) <= bus2)) ##1:3 (s1 or s2));

end property sequence s2;

19000        25000

((bus1 >= 1) ##2:3 (t1 == t2));

TRUE        FALSE end seqence

↙ 72

SHRINK   EXPAND   EXPAND ALL   BACK

FIG. 7

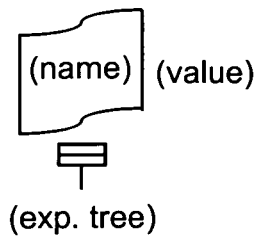 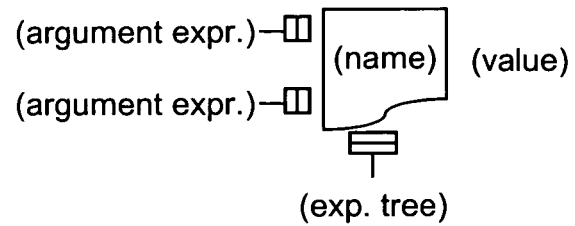
FIG. 12
FIG. 13
(expression string)
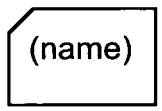 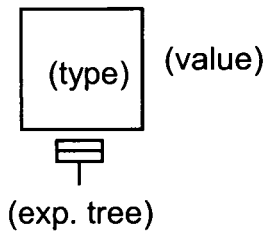 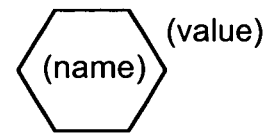
FIG. 14  FIG. 15  FIG. 16
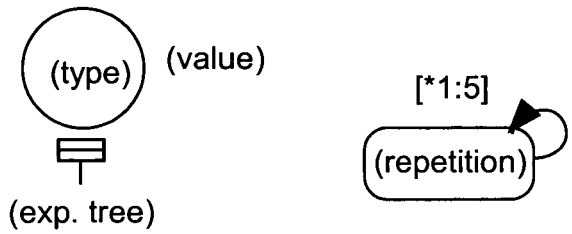 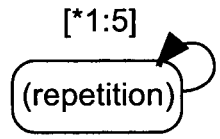
FIG. 17  FIG. 18
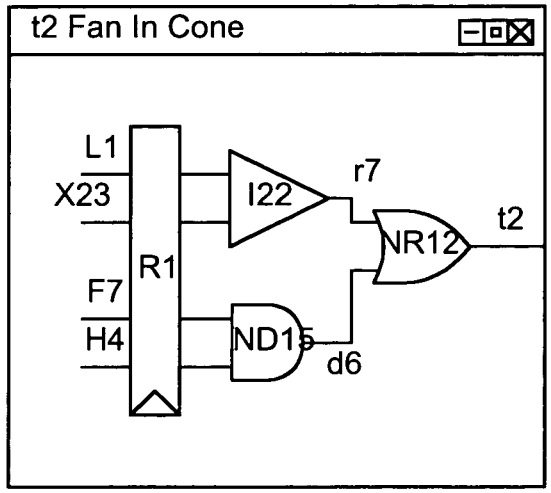
FIG. 19

ACTIVE TRACE ASSERTION BASED VERIFICATION SYSTEM

BACKGROUND OF THE INVENTION

1. Field of the Invention

The invention relates in general to assertion based verification and in particular to a system for analyzing the output of a circuit simulator to determine whether a circuit design possesses assertion properties, and whether it violates or fulfills the assertion properties, and for generating a display helping a user trace sources of the assertion property violations and fulfillments.

2. Description of Related Art

A circuit designer initially employs a hardware description language (HDL) such as Verilog to describe the behavior of an integrated circuit or a portion of an IC, using HDL statements to define logical relationships between signals. The designer then uses a computer-aided synthesis tool to create a gate level circuit design describing the circuit as a set of interconnected instances of standard circuit components ("standard cells") such as transistors, logic gates and memories. After producing the gate level description, the designer uses computer-aided placement and routing tools to generate an integrated circuit (IC) layout design, providing a guide for IC fabrication by indicating the structure, position and orientation of each cell within the IC and indicating the routes signal paths follow between the cell terminals. The HDL description is further updated to include models of the temporal behavior signal paths interconnecting cell terminals.

To determine whether the circuit described by an HDL file at any stage of the design process will behave as expected, a designer can program a circuit simulator to simulate its response to a set of input signals. A simulator program (a "testbench") includes the HDL description of the circuit, specifies the time-varying behavior of the circuit's input signals, indicates which of the circuit's input, internal and output signals are to be monitored during the simulation, and specifies various other parameters of the simulation. As it simulates the circuit, the simulator produces a "dump file" indicating the behavior of the monitored signals over time. The designer can use debugging tools to study the circuit behavior represented by the dump file to determine whether the circuit will behave as expected.

As circuits grow larger and more complex, it has become increasingly difficult and time consuming to fully test and debug circuit designs using simulation alone. In recent years, designers have begun supplementing simulation with "assertion based verification". Assertions describe certain properties of a circuit that are expected to hold true. For example, an assertion may indicate that a property of the output data of an adder should always match the sum of its input data values within some specified time range after the adder is clocked. Assertion based verification tools external to a simulator can evaluate such assertions based on the signal data included in the dump file, provided that the dump file contains all signal data needed to evaluate the assertion.

A designer may incorporate "assertion statements" into the HDL description of a circuit executed by a simulator which do not affect the nature of the circuit described by the HDL design, but which tell the simulator to determine whether the circuit exhibits various properties the assertion statements describe and to report any instance in which a property fails to hold true. Thus even when the simulator is not programmed to include signal data need to evaluate an assertion among the data describing "observable" signals normally recorded in the dump file, the simulator can nonetheless monitor those signals and report any property violation including values of any signals needed to evaluate the property at the time of the violation. U.S. Patent Application Publication 2006/0085774 filed Oct. 14, 2004 teaches an assertion report produced by a simulator.

Generally, there are two kinds of assertions. Concurrent (also called "declarative") assertions state that a given property must always be true throughout a simulation, while immediate assertions apply only for a limited time, or under specified conditions. The following example illustrates a typical syntax of a declarative assertion statement. The assert statement specifies that the property, test_adder, should yield FALSE if it is violated, or yield TRUE if it is fulfilled.

assert property (test_adder);

A testable property, such as test_adder, within an assertion may be a function of one or more signal values at specific times s can be a simple Boolean expression such as, for example,

```
property p0;
    @(posedge clk)
    t1 + t2 >= 1;
end property
```

This expression indicates that the sum of values represented by signals t1 and t2 should be greater than or equal to 1 on the positive edge of the CLK signal. A property can also be in the form of a "sequence" of expressions to be evaluated in increasing order of time, such as for example,

```
property p1;
    @(posedge clk)
    ((((t1+t2) >= 1)
    ##1:3 ((t1+bus2) >= (bus1 - t2) +2)))
    ##2 ((bus1 +(t1 && !t2)) <=bus2))
    ##1:3 (s1 or s2);
end property
```

The above property indicates the following:
1. On the positive edge of a clock signal clk: the expression t1+t2>=1 should be TRUE.
2. On one of the next three clk signal edges, the expression (t1+bus2)>=(bus1−t2)+2) should become TRUE,
3. Two clock cycles later, the expression (bus1+(t1 && !t2))<=bus2 should be TRUE.
4. On one of the next three clk signal edges, the expression (s1 or s2) should become TRUE.

The p1 property will be FALSE if any one of its five expressions are FALSE and will be TRUE only if each of the five expressions is TRUE. Note that the simulator will require many clock cycles to evaluate the full expression.

Thus the assertion not only defines a property using a sequence of expressions, but it also defines an evaluation time corresponding to each expression, wherein the "evaluation time" is a simulation time at which the expression evaluates true or false. For example the property p1 term $$\#\#1:3((t1+bus2) >= (bus1-t2)+2)))$$

means that the evaluation time for expression ((t1+bus2)>= (bus1−t2)+2) should be either on the first, second or third clock signal clk edge following the evaluation time of the preceding expression (t1+t2)>=1. If the expression ((t1+bus2)>=(bus1−t2)+2) evaluates true on any of those three clock edges, then its "evaluation time" is the simulation time corresponding to the first one of those three clock signal edges. If the expression ((t1+bus2)>=(bus1−t2)+2) fails to evaluate true on any of those three clock edges, then its "evaluation time" is the simulation time corresponding to the last one of those three clock signal edges. The code "#1:3" thus defines the evaluation time of the expression.

One sequence may be nested within another. For example in the above expressions s1 and s2 are names of separately defined sequences. For example sequence s1 may be defined by the following code:

```
sequence s1;
    ((t1 == 1) ##3 ((bus1 >2) && (t2 == 1));
end sequence
```

Thus a circuit property is expressed as a sequence of one or more expressions, each of which is a function of one or more variables, such as t1, bus1 or s1, each representing the value of either a signal, a group of signals or of another sequence. Each expression of a property is evaluated at a corresponding evaluation time defined by the assertion.

An assertion statement causes a simulator to report when a simulated circuit fails to exhibit the property and to report the states of the signals that affect the property evaluation. By providing targets for formal verification, assertions improve controllability by improving test coverage and observability, however although a designer can determine from an assertion message that a circuit design failed to exhibit a particular property at a particular time during the simulation, the message does not directly indicate where the source of the error lies in the circuit design. To determine that, the designer needs to analyze both the assertion statement and the circuit design to trace the error back to its source. What is needed is a system for helping the designer does that.

SUMMARY OF THE INVENTION

An assertion expresses an expected property of a simulated circuit as an expression or a series of expressions, each a function of one or more variables, where each variable is either one of the signal values or a value of another (nested) expression or expressions. The assertion separately defines an evaluation time for each expression, wherein the evaluation time is a particular simulation time at which the expression is to be evaluated based on values of circuit signals at that particular simulation time. Each expression of a property must evaluate true if the circuit has the property.

In accordance with the invention, a computer displays a separate representation of each expression of a property, including a separate variable symbol for each variable of each expression. For each expression that evaluated false, the computer identifies each variable that likely caused that expression to evaluate false and distinctively marks that variable's symbol within the display, for example by highlighting the variable symbol. For each expression that evaluated true, the computer identifies the value for each variable that contributes to the fulfillment of the expression. The computer also annotates the representation of each expression with its corresponding evaluation time and annotates each displayed variable symbol with a value of the variable it represents. When a user selects a variable symbol representing a nested sequence and requests a display of the nested sequence, the computer generates that display including a representation of each expression of the nested sequence and symbols for each variable of those expressions, distinctively marking the symbol of any variable likely to have caused any expression of the nested sequence to evaluate false.

The invention thus helps a user determine why a circuit failed to exhibit an expected property or how a circuit fulfilled an expected property.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

BRIEF DESCRIPTION OF THE DRAWINGS

FIGS. 3-11 depict displays produced in accordance with the invention.

FIGS. 12-18 depict example symbols that may be employed in a display produced in accordance with the invention.

FIG. 19 depicts a display produced in accordance with the invention by the computer of FIG. 1.

DETAILED DESCRIPTION OF THE INVENTION

The invention relates to a system employing assertion based verification for analyzing and displaying results of a circuit simulation and for helping a user trace sources of assertion property violations. The following describes an exemplary mode of practicing the invention as recited in the claims appended to this specification. Although the following description includes numerous details in order to provide a thorough understanding of the exemplary mode, it will be apparent to those of skill in the art that other modes of practicing the invention need not necessarily incorporate all such details.

Figure 1:
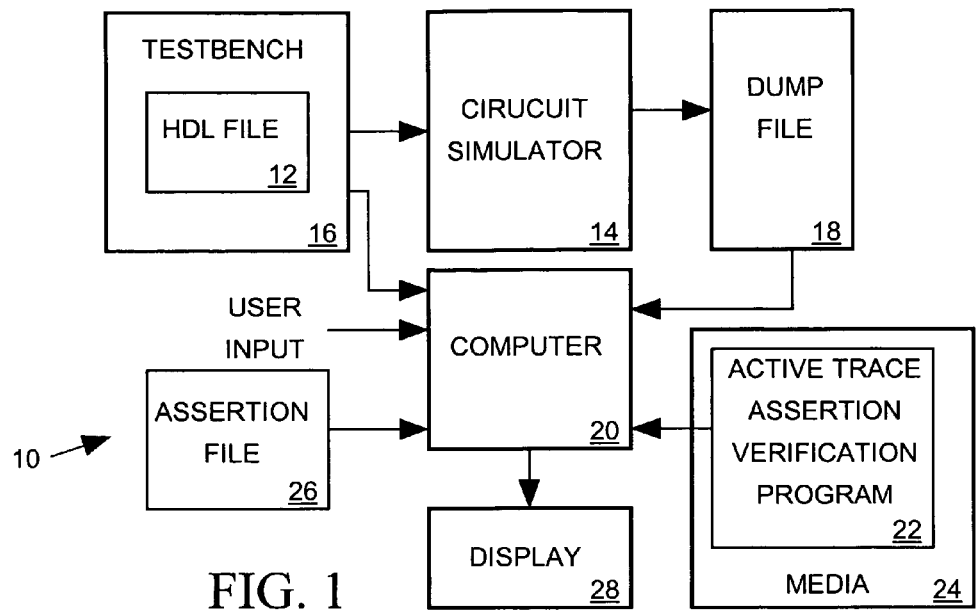
FIG. 1 is a data flow diagram illustrating a system in accordance with the invention for simulating a circuit and for helping a user debug the circuit design.

FIG. 1 is a data flow diagram illustrating a system 10 for simulating a circuit described by a hardware description language (HDL) file 12 and for helping a user verify the circuit design. A circuit simulator 14, programmed by a testbench 16 including HDL file 12 simulates the response of the circuit described by the HDL file in response to input signal patterns described by test bench 16 to produce a dump file 18 indicating times during the simulation at which various circuit signals change state, and the states to which they change. In addition to statements describing the circuit to be simulated, HDL file 12 includes assertion statements which may be automatically generated by conventional computer-aided formal verification tools. The assertion statements do not affect the nature of the circuit described by HDL file 12, but each assertion statement specifies a circuit property and tells simulator 14 to monitor the circuit behavior for conformance to that property and to include a report in dump file 18 whenever the simulator detects a property referenced by an assertion statement fails to hold true. The report indicates the assertion statement that was violated and indicates values of any signals needed to evaluate the assertion statement.

In accordance with the invention, a conventional computer 20 programmed by an active trace verification program 22 provided on computer-readable media 24 such as for example, a compact disk, hard disk, USB drive or other media, processes dump file 18, HDL file 12 and an assertion file 26 describing various assertion statements to generate displays on a display monitor 28 in response to user input. As discussed below, the displays help the user to determine the cause of any property violation or fulfillment.

Figure 2:
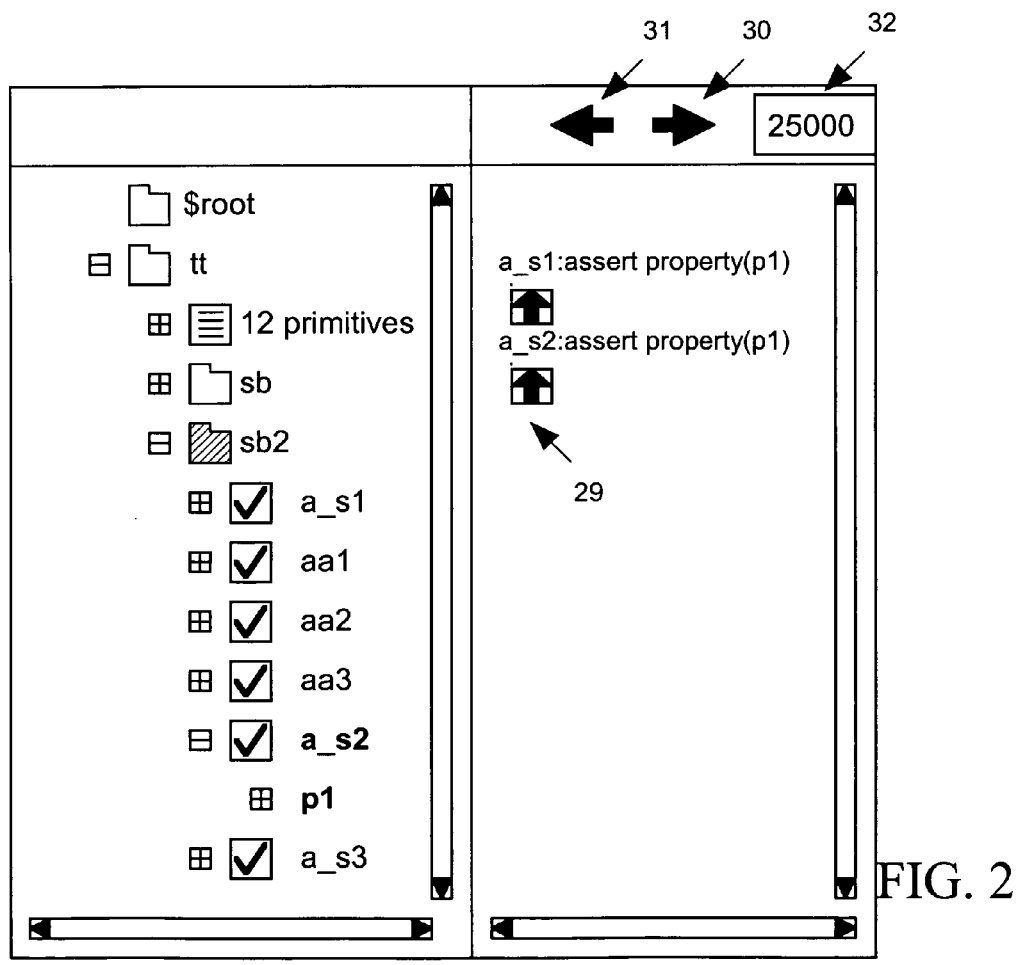

Computer 20 initially processes dump file 18 and assertion file 26 to display a window as illustrated in FIG. 2 including a text display of names of all assertion statements included in assertion file 26. In this example the assertion statements are named a_s1, a_s2, a_s3, aa1, aa2 and aa3. File 26 organizes the assertion statements into a hierarchical file structure, and display 29 reflects that file structure. A source code window to the right represents the corresponding assertion statement. A user can select an assertion in the source code window and click the forward arrow 30 or backward arrow 31 to increase or decrease the simulation time indicated in box 32. In the example of FIG. 2, the user has selected assertion a_s2 and clicked forward arrow 30 to increase the simulation time.

Figure 3:
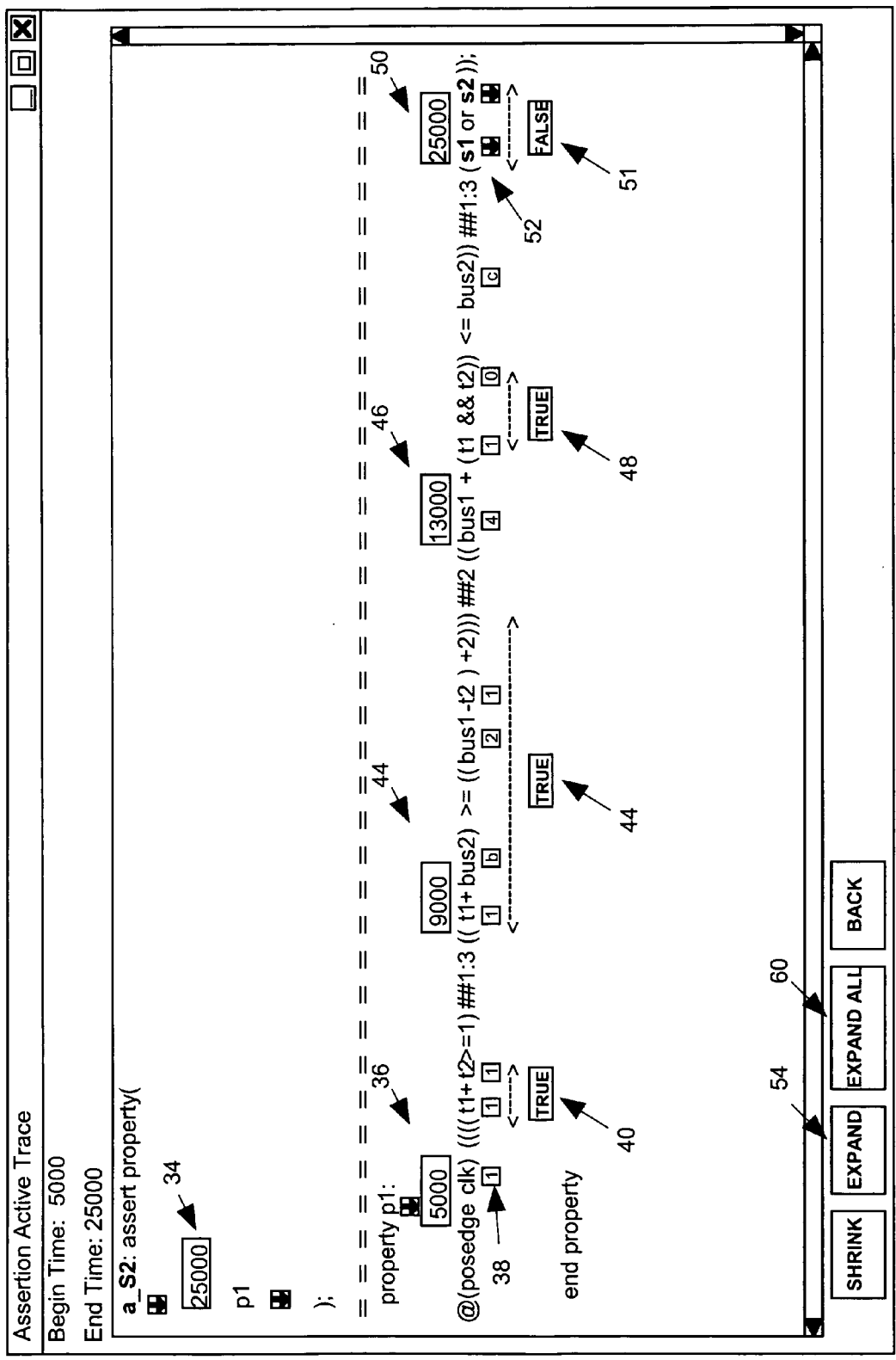

When the user then mouse clicks to select the highlighted a_s2 assertion name, computer 20 displays a pop-up menu (not shown) allowing the user to select a menu item "Assertion Active Trace". Computer 20 responds to the menu item selection by generating the "Assertion Active Trace" window illustrated in FIG. 3 which initially includes a representation of assertion statement a_s2 including a representation of the property it invokes. The user-selected selected simulation time (25000) appears in a box 34. Computer 20 processes dump file 18 to evaluate the various signals and expressions within the property statement shown in the active trace window and then annotates the property statement as shown in FIG. 3. In this example, property p1 includes a sequence of expressions, each of which should hold true if the circuit has the property. The property statement defines an evaluation time for the first expression (t1+t2>=1) by indicating that the expression should be evaluated using signal values from the dump file as of a positive edge of a clock signal (clk) which occurred at simulation time 5000 nsec. Computer 20 annotates the evaluation time (5000 nsec) for that first expression in a box 36 above the expression and indicates the states of the clk, t1 and t2 signals as of that time in boxes 38 below the signal names. Evaluating expression (t1+t2>=1) as of its defined evaluation time, computer 20 finds the expression to be true and adds a TRUE symbol 40 to the display below that expression to indicate that the expression is true.

Property p1 also defines an evaluation time for the next expression (t1+bus2)>=(bus1−t2)+2) of the property sequence using the code "##1:3". This code indicates that on at least one of the first, second or third edges of the clk signal following the edge occurring at the evaluation time 5000 nsec of first expression (t1+t2>=1), the next expression (t1+bus2)>=(bus1−t2)+2) should become TRUE. Computer 20 therefore evaluates that next expression on subsequent edges of the clk signal until it finds the expression first evaluated TRUE on an edge corresponding to simulation time 9000. Computer 20 annotates the expression with the TRUE symbol 42 and with the evaluation time 9000 as seen in box 44.

The code "##2" preceding next expression (bus1+(t1 && !t2)) of the p1 property sequence indicates that on the second clock edge after the evaluation time 9000 of the preceding expression, the expression (bus1+(t1 && !t2))<=bus2 should become TRUE. Computer 20 finds that it did become TRUE on that clock signal edge (at simulation time 13000), and therefore annotates that expression with its evaluation time 13000 in a box 46 and with a TRUE symbol 48 proximate to the expression.

Finally property P1 holds that its last expression (s1 or s2) should become TRUE on one of the first, second or third clock signal positive edges after the evaluation time (13000) of the preceding expression. In this case computer 20 determined that the expression (s1 or s2) remained FALSE on each of those three clock edges and therefore annotated the expression with a FALSE symbol 51 and, in box 50, with its evaluation time, the simulation time (25000 ns) of occurrence of the third clk edge following the evaluation time 13000 of the preceding sequence expression.

Computer 20 displays at the top of the Assertion Active Trace window the evaluation times 5000 and 25000 of the first and last expressions of the property statement. The evaluation time for the assertion is defined as the evaluation time (25000) of the last expression of its property and the circuit is considered to have violated the property described by the assertion at simulation time 25000.

Figure 4:
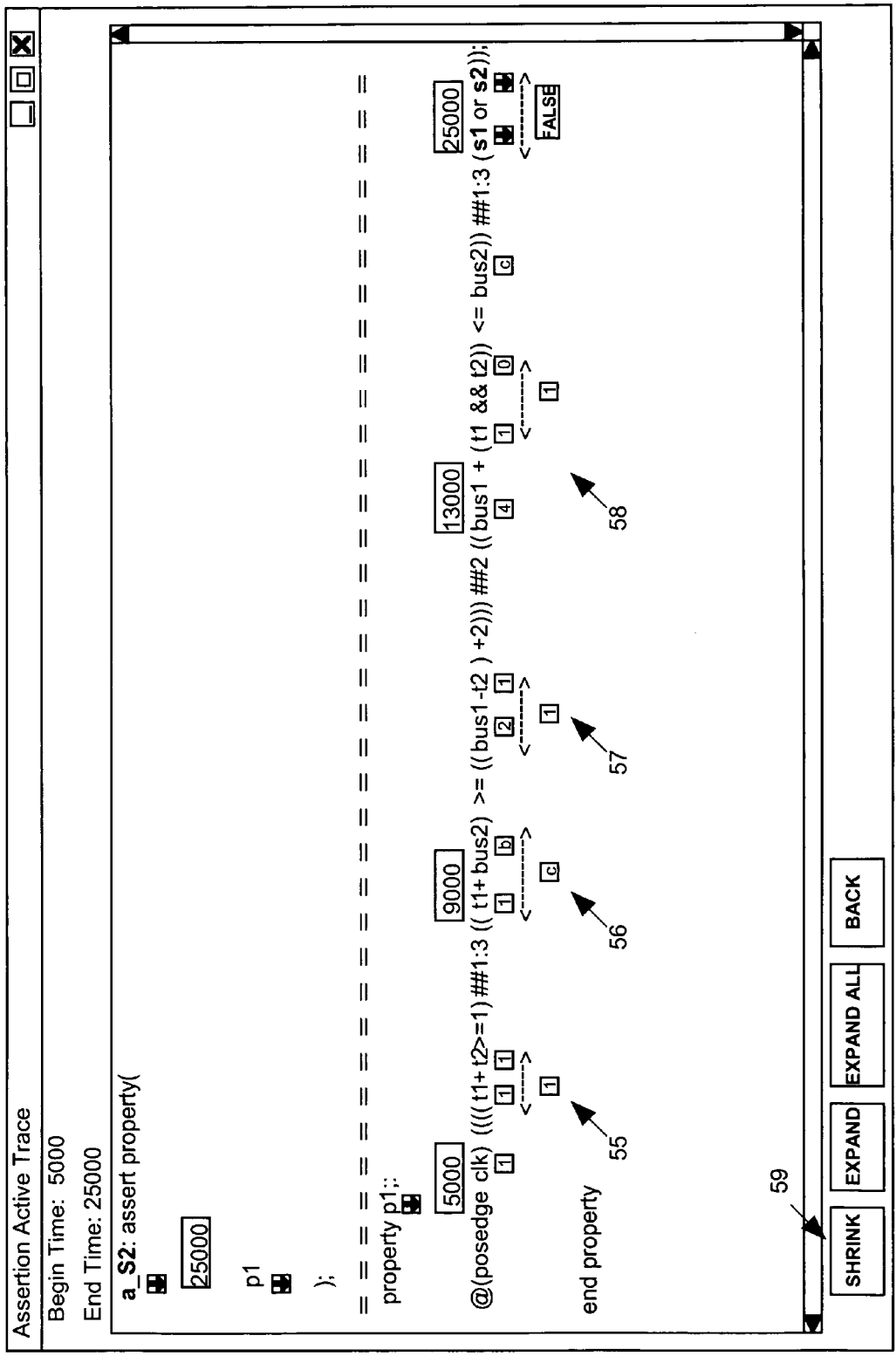

The user can press an EXPAND button 54 to request computer 20 to modify the display of FIG. 3 as shown in FIG. 4 to show a next lower level of subexpression evaluations. Boxes 55-58 show the evaluations of subexpressions (t1+t2), (t1+bus2), (bus1−t2+2) and (bus1+(t1 && !t2)), respectively. The user can revert to the display of FIG. 3 by clicking on a SHRINK button 59.

Figure 5:
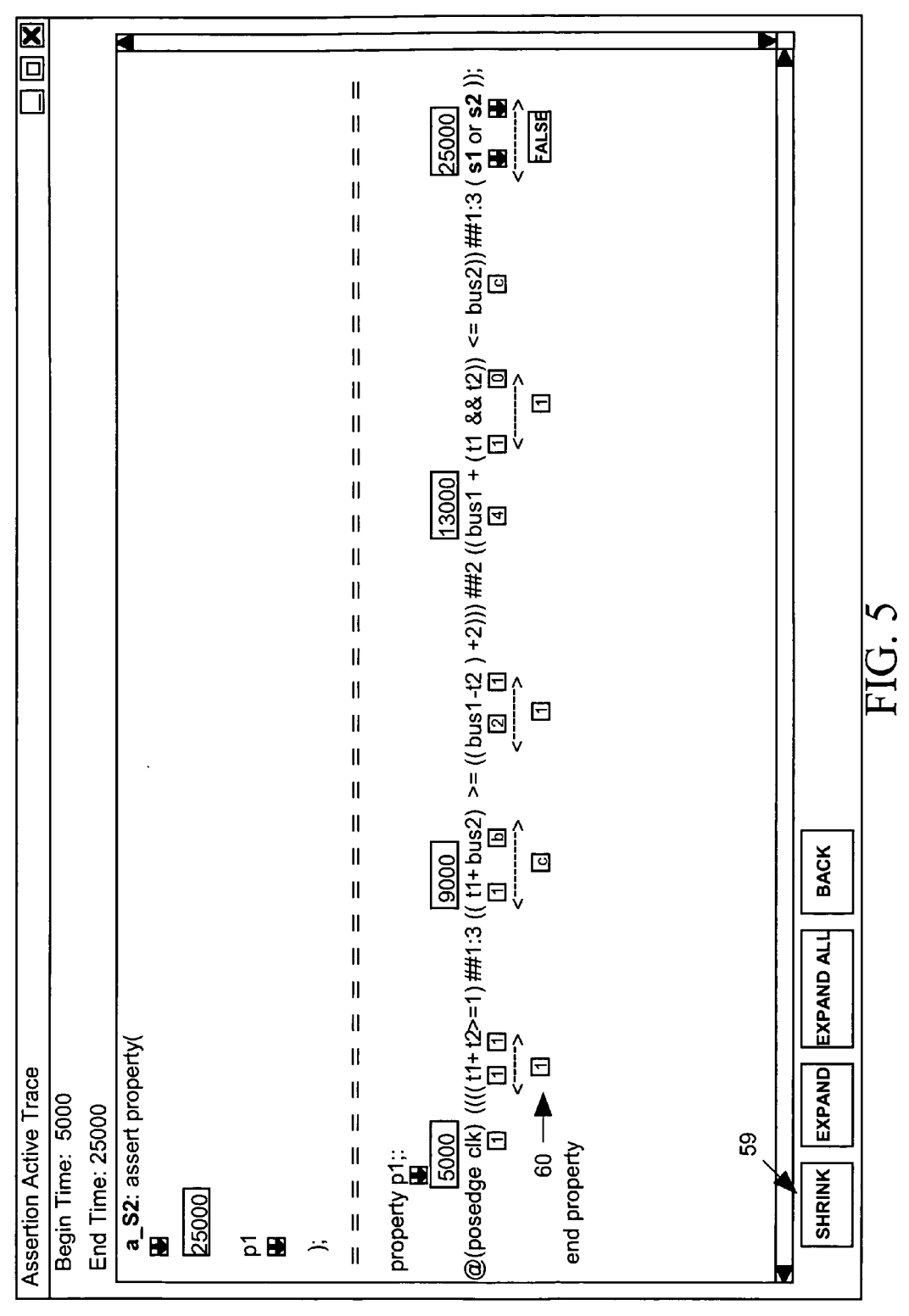

Referring to FIG. 4, the user can press an EXPAND ALL button 60 to request computer 20 to modify the display of FIG. 3 as shown in FIG. 5 wherein the lowest level subexpression evaluations are shown. Boxes 55-58 show the evaluation of subexpressions (t1+t2), (t1+bus2), (bus1−t) and (!t2) respectively. The user can revert to the display of FIG. 3 by clicking on SHRINK button 59.

Referring again to FIG. 3, in the definition of property p1, variables t1, t2, bus1, bus2 represent values of one or more signals. Computer 20 annotates the display using boxes 38 to display the symbol values at the relevant simulation times. Variables s1 and s2 represent values of nested sequences as indicated by symbols 52 below the sequence names, and computer 20 must evaluate sequences s1 and s2 in order to evaluate the expression (s1 or s2). Since both sequences s1 and s2 evaluated false, expression (s1 or s2) evaluated false. To provide the user with an indication as to why expression (s1 or s2) evaluated false, computer 20 highlights the display of both variable symbols s1 and s2 since it was necessary for the sequences referenced by both variables to evaluate false in order for the expression (s1 or s2) to evaluate false. Highlighting variables that are likely candidates for causing the assertion failure helps the user to trace the source of the property failure. While in the preferred embodiment of the invention, such likely candidates are highlighted, it should be understood that they can be distinctively marked in other ways, such as for example by setting them to distinctive colors.

The annotations of the expression (s1 or s2) tell the user that the simulated circuit failed to satisfy that expression of property p1 at time 25000, and might therefore like to view representations of the highlighted nested sequences s1 and s2 that are likely causes of the failure to determine which expressions of those sequences failed. To request an annotated display of sequence s1, the user double clicks on the s1 symbol, and computer 20 responds by modifying the display to add the sequence s1 definition display 62 as shown in FIG. 6.

FIG. 6 shows sequence s1 displayed with its expressions annotated by their evaluation times (boxes 62) and signals annotated by their values (boxes 64). Symbols (boxes 66) under various expressions indicate whether the expressions are TRUE or FALSE. Since the expression ((bus1>=2)&&(t2==1)) evaluated FALSE, and since variable t2 was a likely candidate for causing the false evaluation, computer 20 highlights the t2 signal symbol so that the user can see the state of signal t2 at time 25000 nsec was a likely source of the property failure. The user can also see that to satisfy the subexpression (t2==1), the state of signal t2 should have been "1" instead of "0".

The user may click a BACK button 68 to revert to a previous display and then request an annotated display of sequence s2 by double clicking on S2 below the s2 symbol. Computer 20 responds by adding the sequence s2 definition display 72 as shown in FIG. 7. Note that the computer has highlighted signal symbols t1 and t2 since an error in either signal could have caused the failure in expression (t1=t2). The user can now deduce, based on the information drawn from the display of FIG. 5 that the state of signal t2 at time 25000 should have been "1" instead of "0". The user may then employ conventional means to debug the circuit design to determine whether there is a design flaw resulting in an error in signal t2 at time 25000. The designer may also choose to review the basis for making assertion a_S2 to determine whether the assertion property definition requiring signal (t1==t2) and (t2==1) at time 25000 was flawed.

Figure 8:
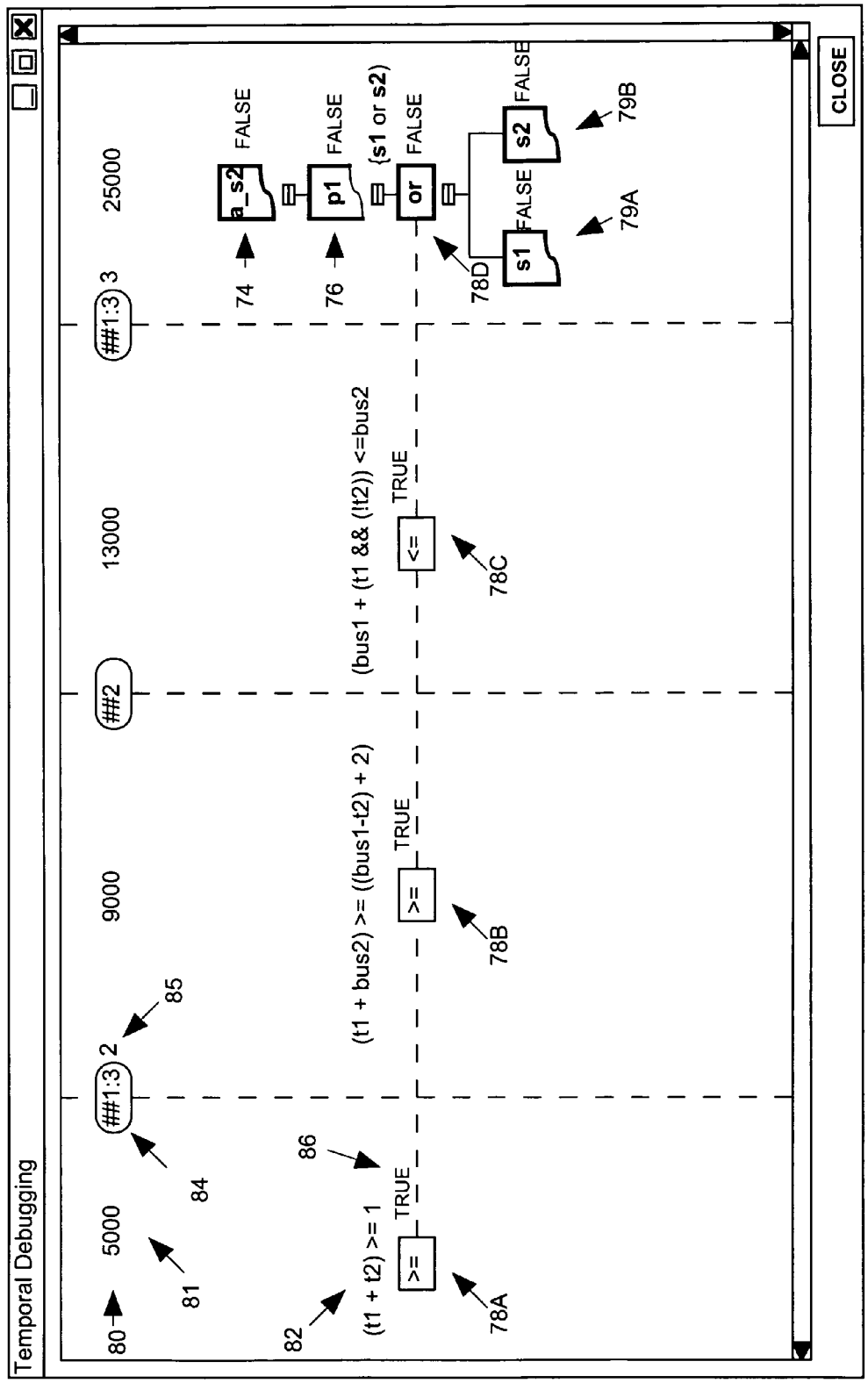

The invention allows the user to alternatively select a "Temporal Debugging" window display as illustrated in FIG. 8 which depicts an assertion in a graphical format. Nodes of the graph include a symbol 74 representing the assertion a_s2, a symbol 76 representing property p1, and symbols 78A-78D representing the four expressions of property p1. The horizontal axis of the window includes a time scale 80 annotated with the evaluation times 81 of the various expressions. The assertion symbol 74, property symbol 76 and expression symbols 78A-78D all reside at positions along the horizontal axis representing their evaluation times. The evaluation time codes corresponding to the expressions appear in boxes 85 horizontally positioned over vertical dashed lines dividing the display into evaluation time zones. Each expression symbol 78A-78D is annotated with the text 82 of its expression and with an appropriate TRUE or FALSE symbol 86 indicating the result of the expression evaluation. The assertion symbol 74, the property symbol 76 and expression symbol 78D are all highlighted to indicate FALSE evaluations. The variables s1 and s2 in the text annotation of symbol 78D are also highlighted to indicate that they are candidates for the property mat failure.

When the user selects any node symbol 78A-78D representing an expression and selects a menu item requesting an expansion of the expression, computer 20 adds a subgraph to the display representing the expression in more detail. In the example of FIG. 8, the user has requested an expansion of the expression represented by symbol 78D and computer 20 responded by adding symbols 79A and 79B representing the two sequence variables s1 and s2 included in the expression (s1 or s2) represented by expression symbol 78D. Symbols 79A and 79B are vertically positioned below symbol 78 and connected to symbol 78 by solid lines to indicate that s1 and s2 are variables of the expression represented by symbol 78D. Symbols 79A and 79B are horizontally positioned in the 25000 nsec time zone to indicate that each has evaluation time 25000.

Figure 9:
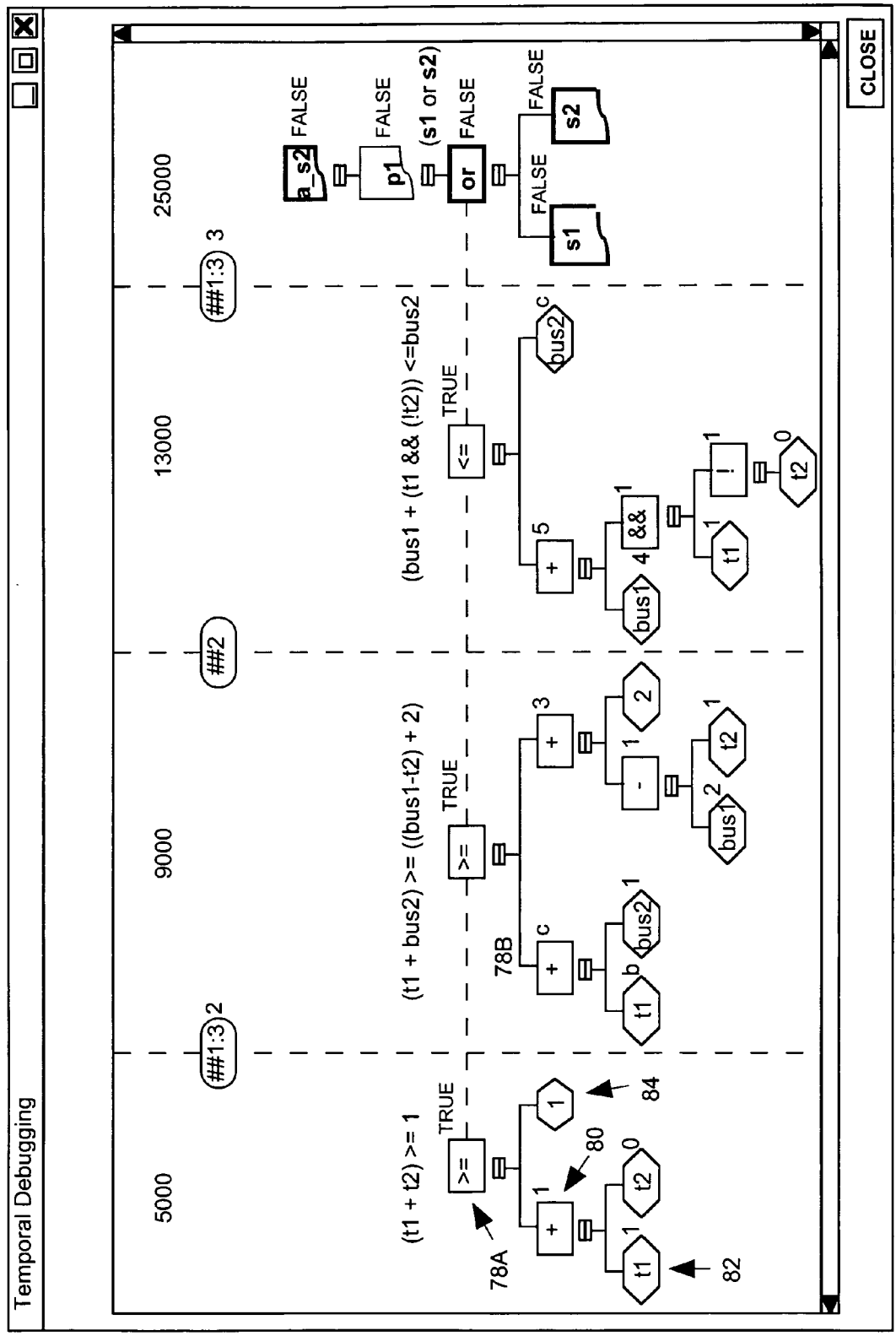

FIG. 9 shows the resulting display after the user has expanded the expressions represented by nodes 78A-78C. A node symbol, such as symbol 80, representing a subexpression of the expression represented by its parent node 78A resides below its parent nodes. A node symbol 82 residing below its parent expression node 80 represents a signal (t1) and its value (1) at a time 5000 appearing next to the node symbol. A node symbol 84 below a parent expression node 78A represents a constant of value indicated by the node symbol. A user can remove a subgraph under an expression node, such as the subgroup residing under expression node 78A by selecting the expression node and selecting a mouse menu command (not shown).

Figure 10:
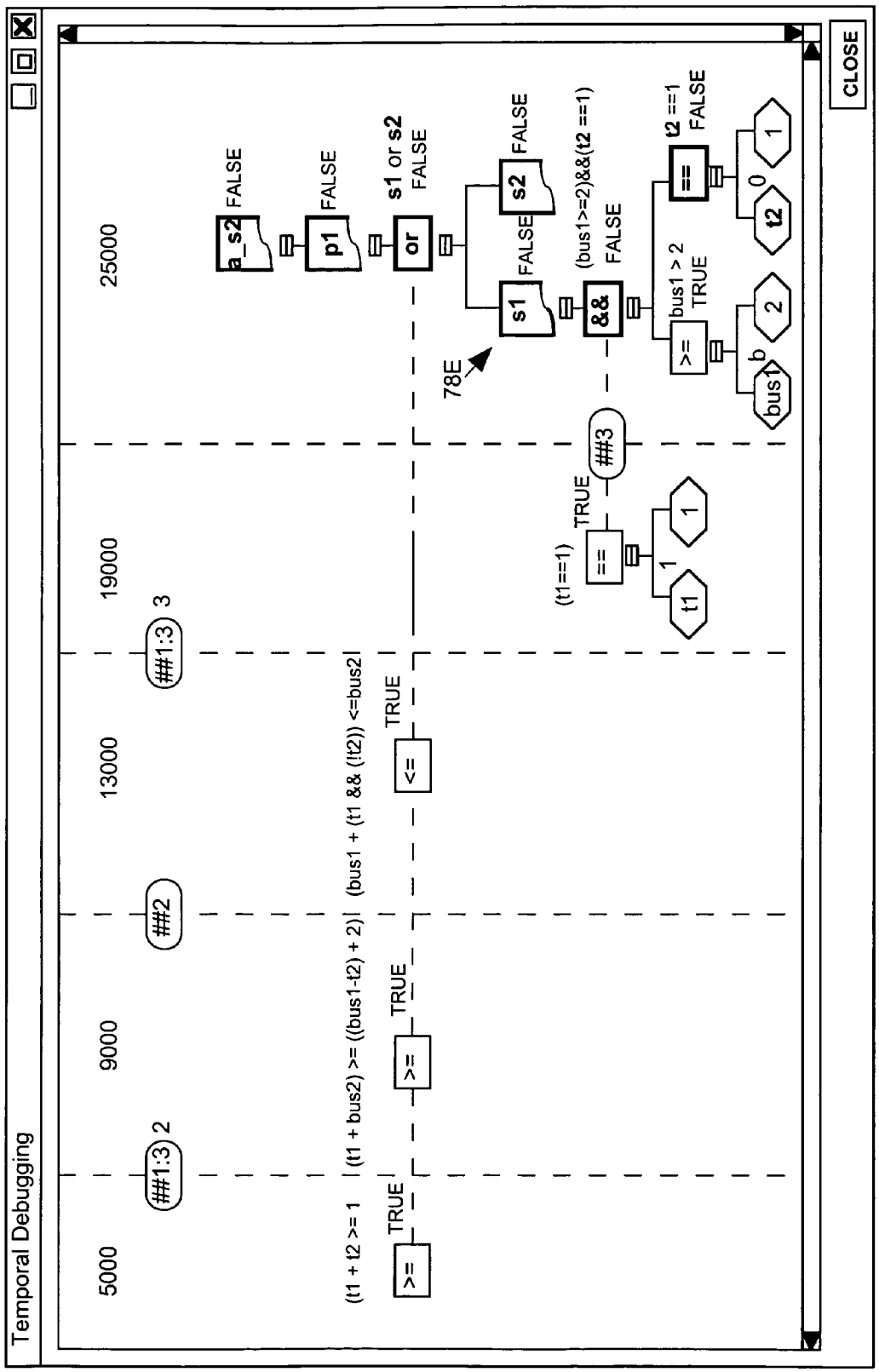
Figure 11:
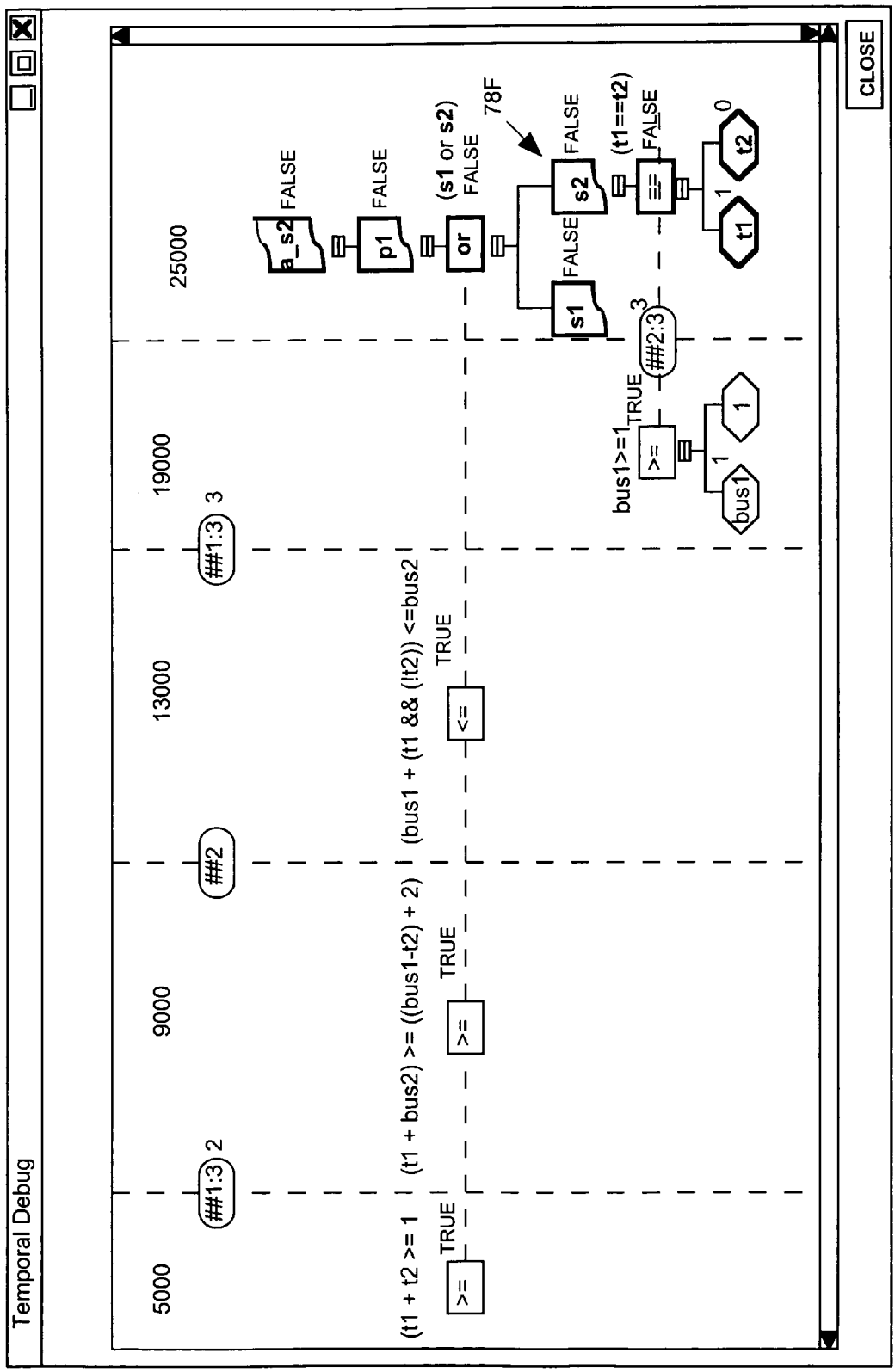

FIG. 10 shows a Temporal Debugging Window in which the user has requested the subgraph display for s1 sequence symbol 78E and FIG. 11 shows a Temporal Debugging Window in which the user has requested the subgraph display for s2 sequence symbol 78F.

The graph in the Temporal Debugging Window can employ various node symbols to represent various types of functions. FIGS. 12-19 illustrate various node symbol examples. FIG. 12 is an assertion symbol. The assertion name annotates the symbol, and its value resides next to it. FIG. 13 is a sequence or property symbol with the property name annotating the symbol and its value residing next to it. FIG. 14 is a function symbol, with the function name residing in the symbol. FIG. 15 is a logic symbol with the logic operator (such as an "or" or a "!") annotating the symbol, the value of the logic operation residing next to the symbol and the expression string that uses the logic operator residing above the symbol. FIG. 16 is a signal symbol with the name of the signal annotating the symbol and the signal's value residing next to it. FIG. 18 is an arithmetic operator function with the operator name annotating the symbol and the value of the arithmetic operation residing next to the symbol. FIG. 18 is a repetition symbol with the repetition number annotating the symbol and the repetition string defining the repletion operation residing above it.

When the user uses a mouse to select a signal symbol in either an Assertion Active Trace window or a Temporal Debugging window and selects a "trace signal" command from a mouse menu, the computer processes HDL file 16 to produce a schematic diagram of the fan-in cone of the signal represented by the signal symbol. For example, FIG. 19 shows a pop-up window the computer might display when the user selects the t2 signal symbol of FIG. 11 and invokes a trace signal command. The fan-in cone of the signal t2 includes only those circuit components producing signals that can influence the value of signal t2.

When the user uses a mouse to select a signal symbol in either an Assertion Active Trace window or a Temporal Debugging window and selects a "trace driver" command from a mouse menu, the computer processes HDL file 16 to generate a display of the particular HDL code that controls a value of the signal represented by the selected signal symbol.

When the user uses a mouse to select a signal symbol in either an Assertion Active Trace Window or a Temporal Debugging Window and selects an "edit" command from a mouse menu, the computer opens HDL file 16 in a conventional text editing program, scrolls to the HDL statement controlling the value of signal represented by the signal symbol and highlights that HDL statement so that the user can edit it.

Thus has been shown and described an active trace assertion system that processes simulation data to evaluate the expressions of a property defined by an assertion and displays a representation of each expression, using a separate variable symbol for each of its variables. For each expression that evaluated false, the computer identifies each variable that caused that expression to evaluate false and distinctively marks that variable's symbol relative to other variable symbols within the display. The computer also annotates the representation of each expression with its corresponding evaluation time and annotates each displayed variable symbol with a value of the variable it represents. When the user selects a variable symbol representing another sequence, the computer generates a similar display of the other sequence;

also distinctively marking which variables causing any expression of the other sequence to evaluate false. The system enables a user to quickly locate sources of property failures.

The invention claimed is:

1. A computer implemented method for generating a display indicating whether a circuit has a property comprising:
   providing an assertion based on data indicating values of signals of the circuit at a succession of simulation times, wherein the assertion expresses the property as a first sequence of expressions, and separately defines for each expression a corresponding evaluation time relative to the succession of simulation times at which the expression is to be evaluated,
   wherein a value of each expression is a function of a value of at least one variable representing either a value of at least one signal of the circuit or a value of another separately defined sequence of expressions, and
   wherein the circuit has the property only if every expression of the first sequence evaluates true at its corresponding evaluation time, the method comprising evaluating each expression of the first sequence by using a computer, identifying the simulation time at which the expression is first time evaluated true and, if at least one of the expressions is evaluated false, performing the further steps of:
   a. displaying the representation of an expression for each of a plurality of the evaluated expressions of the first sequence, wherein the representation of the expression comprises a separate variable symbol for each of its variables;
   b. annotating the displayed representation of each expression which was evaluated true with its corresponding identified simulation time at which the expression was first time evaluated true, without showing tick-by-tick evaluating steps to annotate the expression.

2. The method in accordance with claim 1 wherein the step b further comprises annotating each variable symbol with a value of the variable it represents at the corresponding identified simulation time.

3. The method in accordance with claim 2 further comprising the step of:
   c. for each expression of the first sequence that is evaluated false at its corresponding evaluation time, identifying each variable that caused the expression to be evaluated false and distinctively marking that variable's symbol relative to other variable symbols within the display.

4. The method in accordance with claim 3 wherein one variable symbol in the display represents a value of a second sequence of expressions, the method further comprising the steps of:
   d. evaluating each expression of the second sequence;
   e. responding to user input selecting the one variable symbol and requesting a display of a representation of the second sequence by displaying that representation including a representation of each expression of the second sequence, wherein each expression representation of the second sequence comprises a separate variable symbol for each of its variables; and
   f. for each expression of the second sequence that evaluates false at a corresponding evaluation time, identifying each variable that caused that expression to evaluate false and distinctively marking that variable's symbol relative to other variable symbols within the display.

5. The method in accordance with claim 4 further comprising the step of:
   g. annotating each displayed representation of an expression of the second sequence to indicate whether the expression evaluated true or false.

6. The method in accordance with claim 4 further comprising the step of:
   g. annotating the displayed representation of each expression of the first sequence and of each expression of the second sequence with its corresponding evaluation time.

7. The method in accordance with claim 1 wherein the display has a horizontal axis representing a time scale, and wherein each representation of an expression of the first sequence includes an expression symbol residing at a position relative to the horizontal axis representing its corresponding evaluation time.

8. The method in accordance with claim 7 wherein each variable symbol representing a variable of an expression of the first sequence resides at a position relative to a vertical axis of the display below the symbol for that expression.

9. The method in accordance with claim 1 further comprising the step of:
   c. responding to user input selecting a signal symbol and invoking a signal trace command by processing a description of the circuit to generate a display of a schematic diagram of a fan-in cone of the signal represented by the selected signal symbol.

10. The method in accordance with claim 1 further comprising the step of:
    c. responding to user input selecting a signal symbol and invoking a trace driver command by processing a description of the circuit to generate a display of HDL code controlling a value of the signal represented by the selected signal symbol.

11. The method in accordance with claim 1 wherein the circuit is described by source code in a text file, the method further comprising the step of:
    c. responding to user input selecting a signal symbol and invoking an edit command by processing the text file to display a representation of a portion of the source code describing a portion of the circuit that generates the signal represented by the selected signal symbol.

12. The method in accordance with claim 4 further comprising the steps of:
    g. annotating each displayed representation of an expression to indicate whether the expression evaluated true or false;
    h. annotating each displayed representation of an expression with its corresponding evaluation time;
    wherein the display has a horizontal axis representing a time scale;
    wherein each representation of an expression of the first sequence and each representation of an expression of the second sequence includes an expression symbol residing at a position relative to the horizontal axis representing its corresponding evaluation time; and
    wherein for each expression of the first and second sequences, each variable symbol representing a variable of that expression resides at a position relative to a vertical axis of the display below a position of the symbol for that expression.

13. The method in accordance with claim 12 further comprising the step of:
    i. responding to user input selecting a signal symbol and invoking a signal trace command by processing a description of the circuit to generate a display of a schematic diagram of a fan-in cone of the signal represented by the selected signal symbol.

14. The method in accordance with claim 12 wherein the circuit is described by source code in a text file, the method further comprising the step of:
  i. responding to user input selecting a signal symbol and invoking an edit command by processing the text file to display a representation of a portion of the source code describing a portion of the circuit that generates the signal represented by the selected signal symbol.

15. Non-transitory Computer-readable media containing a program which when read and executed by a computer causes the computer to implement a method for generating a display indicating whether a circuit has a property comprising:
  providing an assertion based on data indicating values of signals of the circuit at a succession of simulation times,
  wherein the assertion expresses the property as a first sequence of expressions, and separately defines for each expression a corresponding evaluation time relative to the succession of simulation times at which the expression is to be evaluated,
  wherein a value of each expression is a function of a value of at least one variable representing either a value of at least one signal of the circuit or a value of another separately defined sequence of expressions, and
  wherein the circuit has the property only if every expression of the first sequence evaluates true at its corresponding evaluation time,
  the method comprising evaluating each expression of the first sequence by using a computer, identifying the simulation time at which the expression is first time evaluated true and, if at least one of the expressions is evaluated false, performing the further steps of:
  a. displaying the representation of an expression for each of a plurality of the evaluated expressions of the first sequence, wherein the representation of the expression comprises a separate variable symbol for each of its variables;
  b. annotating the displayed representation of each expression which was evaluated true with its corresponding identified simulation time at which the expression was first time evaluated true, without showing tick-by-tick evaluating steps to annotate the expression.

16. The computer-readable media in accordance with claim 15 wherein the step b further comprises annotating each variable symbol with a value of the variable it represents at the corresponding identified simulation time.

17. The computer-readable media in accordance with claim 16 wherein the method further comprises the step of:
  c. for each expression of the first sequence that is evaluated false at its corresponding evaluation time, identifying each variable that caused the expression to be evaluated false and distinctively marking that variable's symbol relative to other variable symbols within the display.

18. The computer-readable media in accordance with claim 17 wherein one variable symbol in the display represents a value of a second sequence of expressions, and wherein the method further comprises the step of:
  d. evaluating each expression of the second sequence;
  e. responding to user input selecting the one variable symbol and requesting a display of a representation of the second sequence by displaying that representation including a representation of each expression of the second sequence, wherein each expression representation of the second sequence comprises a separate variable symbol for each of its variables; and
  f. for each expression of the second sequence that evaluates false at a corresponding evaluation time, identifying each variable that caused that expression to evaluate false and distinctively marking that variable's symbol relative to other variable symbols within the display.

19. The computer-readable media in accordance with claim 18 wherein the method further comprises the step of:
  g. annotating each displayed representation of an expression of the second sequence to indicate whether the expression evaluated true or false.

20. The computer-readable media in accordance with claim 18 wherein the method further comprises the step of:
  g. annotating the displayed representation of each expression of the first sequence and of each expression of the second sequence with its corresponding evaluation time.

21. The computer-readable media in accordance with claim 15 wherein the display has a horizontal axis representing a time scale, and wherein each representation of an expression of the first sequence includes an expression symbol residing at a position relative to the horizontal axis representing its corresponding evaluation time.

22. The computer-readable media in accordance with claim 21 wherein each variable symbol representing a variable of an expression of the first sequence resides at a position relative to a vertical axis of the display below the symbol for that expression.

23. The computer-readable media in accordance with claim 15 wherein the method further comprises the step of:
  c. responding to user input selecting a signal symbol and invoking a signal trace command by processing a description of the circuit to generate a display of a schematic diagram of a fan-in cone of the signal represented by the selected signal symbol.

24. The computer-readable media in accordance with claim 15 wherein the method further comprises the step of:
  c. responding to user input selecting a signal symbol and invoking a trace driver command by processing a description of the circuit to generate a display of HDL code controlling a value of the signal represented by the selected signal symbol.

25. The computer-readable media in accordance with claim 15 wherein the circuit is described by source code in a text file, and wherein the method further comprises the step of:
  c. responding to user input selecting a signal symbol and invoking an edit command by processing the text file to display a representation of a portion of the source code describing a portion of the circuit that generates the signal represented by the selected signal symbol.

26. The computer-readable media in accordance with claim 18 wherein the method further comprises the step of:
  g. annotating each displayed representation of an expression to indicate whether the expression evaluated true or false;
  h. annotating each displayed representation of an expression with its corresponding evaluation time;
  wherein the display has a horizontal axis representing a time scale;
  wherein each representation of an expression of the first sequence and each representation of an expression of the second sequence includes an expression symbol residing at a position relative to the horizontal axis representing its corresponding evaluation time; and
  wherein for each expression of the first and second sequences, each variable symbol representing a variable of that expression resides at a position relative to a vertical axis of the display below a position of the symbol for that expression.

27. The computer-readable media in accordance with claim 26 wherein the method further comprises the step of:

i. responding user input selecting a signal symbol and invoking a signal trace command by processing a description of the circuit to generate a display of a schematic diagram of a fan-in cone of the signal represented by the selected signal symbol.

28. The computer-readable media in accordance with claim 26 wherein the circuit is described by source code in a text file, and wherein the method further comprises the step of:

i. responding to user input selecting a signal symbol and invoking an edit command by processing the text file to display a representation of a portion of the source code describing a portion of the circuit that generates the signal represented by the selected signal symbol.

29. The computer readable media in accordance with claim 15, wherein the step of identifying each variable that caused the expression to evaluate false and distinctively mark that variable's symbol relative to other variable symbols within the display includes associating the variable's symbol with a distinct symbol indicating that the variable represented by the associated symbol caused the expression to evaluate false.

30. The method in accordance with claim 1, wherein the step of identifying each variable that caused the expression to evaluate false and distinctively mark that variable's symbol relative to other variable symbols within the display includes associating the variable's symbol with a distinct symbol indicating that the variable represented by the associated symbol caused the expression to evaluate false.

31. The method in accordance with claim 3 wherein each variable that caused that expression to evaluate false is distinctively marked by highlighting that variable's symbol.

32. The method in accordance with claim 3 further comprising the step of:

c. annotating the representation of each expression with a symbol indicating a result of evaluating the expression.

33. The computer-readable media in accordance with claim 17 wherein each variable that caused that expression to evaluate false is distinctively marked by highlighting the variable.

34. The computer-readable media in accordance with claim 18 wherein the method further comprises the step of:

c. annotating the representation of each expression with a symbol indicating a result of evaluating the expression.

* * * * *